United States Patent
Zhao et al.

(10) Patent No.: US 10,718,978 B2
(45) Date of Patent: Jul. 21, 2020

(54) APPARATUS FOR IMPROVING OPTICAL ALIGNMENT OF PANELS MANUFACTURED ON A SAME MOTHER SUBSTRATE

(71) Applicant: SHENZHEN CHINA STAR OPTOELECTRONICS TECHNOLOGY CO., LTD., Shenzhen (CN)

(72) Inventors: Li Zhao, Shenzhen (CN); Bangyin Peng, Shenzhen (CN)

(73) Assignee: SHENZHEN CHINA STAR OPTOELECTRONICS TECHNOLOGY CO., LTD., Shenzhen (CN)

( * ) Notice: Subject to any disclaimer, the term of this patent is extended or adjusted under 35 U.S.C. 154(b) by 311 days.

(21) Appl. No.: 15/324,975

(22) PCT Filed: Nov. 24, 2016

(86) PCT No.: PCT/CN2016/107092
§ 371 (c)(1),
(2) Date: Feb. 23, 2018

(87) PCT Pub. No.: WO2018/040311
PCT Pub. Date: Mar. 8, 2018

(65) Prior Publication Data
US 2018/0180946 A1    Jun. 28, 2018

(30) Foreign Application Priority Data
Aug. 31, 2016   (CN) .......................... 2016 1 0799793

(51) Int. Cl.
*G02F 1/1337* (2006.01)
*G02F 1/1333* (2006.01)
(Continued)

(52) U.S. Cl.
CPC ...... *G02F 1/133788* (2013.01); *G02F 1/1303* (2013.01); *G02F 1/1334* (2013.01);
(Continued)

(58) Field of Classification Search
CPC ..... G03F 1/00; G03F 1/38; G03F 1/42; G03F 1/144; G03F 1/50; G03F 7/70283; G02F 1/133788; G02F 1/133351; G02F 1/1303
(Continued)

(56) References Cited

U.S. PATENT DOCUMENTS

| 10,082,688 B2* | 9/2018 | Zhao | G02F 1/133788 |
| 2005/0142465 A1* | 6/2005 | Park | G02F 1/133351 |
| | | | 430/7 |

(Continued)

FOREIGN PATENT DOCUMENTS

| CN | 102725680 A | 10/2012 |
| CN | 103034045 A | 4/2013 |

(Continued)

*Primary Examiner* — John A McPherson

(57) ABSTRACT

Disclosed is an apparatus for improving optical alignment of panels manufactured on a same mother substrate. The technical defect in the prior art which affects product quality can be eliminated. The apparatus for improving optical alignment of panels manufactured on a same mother substrate includes a mother substrate (1), N columns of chips in a first group (2), N columns of chips in a second group (3), and a photomask (4). The N columns of chips in the first group (2) and the N columns of chips in the second group (3) are arranged in an alternate manner and are arranged on the mother substrate (1). An area of the chips in the second group (3) is larger than an area of the chips in the first group (2). The photomask (4) covers the N columns of chips in the first group (2) and the N columns of chips in the second group (3) so that ultraviolet irradiates the N columns of chips in the first group (2) and the N columns of chips in the (Continued)

second group (3) after passing through the photomask (4). N is a positive integer. The apparatus can be used in manufacturing of TFT-LCD.

8 Claims, 6 Drawing Sheets

(51) Int. Cl.
*G02F 1/13* (2006.01)
*G02F 1/1334* (2006.01)
*G03F 1/32* (2012.01)
*G03F 1/42* (2012.01)

(52) U.S. Cl.
CPC .......... *G02F 1/133351* (2013.01); *G03F 1/32* (2013.01); *G03F 1/42* (2013.01); *G02F 1/133753* (2013.01); *G02F 2001/13345* (2013.01); *G02F 2001/133757* (2013.01)

(58) Field of Classification Search
USPC .............................. 430/5, 320, 321; 349/124
See application file for complete search history.

(56) References Cited

U.S. PATENT DOCUMENTS

| 2014/0218671 A1 | 8/2014 | Jung et al. |
| 2017/0146864 A1* | 5/2017 | Lee ........................ G02F 1/1303 |
| 2018/0107073 A1 | 4/2018 | Ma et al. |

FOREIGN PATENT DOCUMENTS

| CN | 105467688 A | 4/2016 |
| CN | 105759508 A | 7/2016 |
| CN | 105842897 A | 8/2016 |
| JP | 2011081227 A | 4/2011 |
| KR | 20130048434 A | 5/2013 |

* cited by examiner

APPARATUS FOR IMPROVING OPTICAL ALIGNMENT OF PANELS MANUFACTURED ON A SAME MOTHER SUBSTRATE

CROSS REFERENCE TO RELATED APPLICATIONS

The present application claims the priority of Chinese patent application CN201610799793.7, entitled "Apparatus for improving optical alignment of panels manufactured on a same mother substrate" and filed on Aug. 31, 2016, the entirety of which is incorporated herein by reference.

FIELD OF THE INVENTION

The present disclosure relates to the technical field of display, and particularly to an apparatus for improving optical alignment of panels manufactured on a same mother substrate.

BACKGROUND OF THE INVENTION

A liquid crystal display module comprises a liquid crystal display panel (liquid crystal molecules in a liquid crystal layer can be aligned by an electric field so that an image can be displayed on the liquid crystal display panel); a backlight module, which can provide light to the liquid crystal display panel; and a shell, in which the liquid crystal display panel and the backlight module are fixed.

The liquid crystal display panel comprises a liquid crystal layer, a pair of substrates (the liquid crystal layer is arranged therebetween), and a pair of polarizers which are fixed on an outer surface of a corresponding substrate. As to an image displayed on the liquid crystal display panel, it is expected that a same display quality can be obtained when an audience watches the panel from various directions. For this purpose, many attempts have been made. For example, a liquid crystal display device in a Vertical Alignment (VA) mode and a liquid crystal display device in a Plane to Line Switching (PLS) mode have been developed. With respect to the liquid crystal display device in the VA mode, verticality of liquid crystal molecules relative to the substrate is taken advantage of. With respect to the liquid crystal display device in the PLS mode, horizontality of liquid crystal molecules relative to the substrate is taken advantage of. Since the liquid crystal molecules in the aforesaid two kinds of display devices have a similar refractive index anisotropy in different directions, the liquid crystal display device in the VA mode and the liquid crystal display device in the PLS mode both have a wide viewing angle.

In order to further improve a viewing angle performance of the display device, a metal wiring pattern and slits or protrusions made of an organic film are formed on a pixel unit so that the liquid crystal molecules can have a similar tilt angle in different directions. However, due to an influence of a fringe field on the liquid crystal molecules, an aperture ratio of the pixel unit would be reduced by the pattern, slits or protrusions. The aperture ratio refers to a ratio of an area of a pixel unit through which light from the backlight module can pass to a total area of the pixel unit. Here, the pixel unit can refer to a pixel of the liquid crystal display panel which shows a basic color.

The liquid crystal molecules are aligned in a same manner according to a same electric potential. Hence, a pre-tilt is formed in the alignment film of the substrate, so that a direction and tilt angle of liquid crystal molecules near the substrate can be fixed. The pre-tilt of the alignment film is formed by a rubbing cloth that is pre-formed on an alignment material of the substrate. However, due to contacts thereof, outside materials would be introduced to the alignment film, or electrostatic charges would be generated on the alignment film, and thus a productivity of the liquid crystal display panel would be reduced when the alignment film is formed by the rubbing cloth. Moreover, since the rubbing cloth needs to be replaced frequently, a producing time and cost would be increased.

In order to improve the productivity of the liquid crystal display panel, an optical alignment technology is introduced. According to the optical alignment technology, the pre-tilt of the alignment film is formed through a non-contact method, and no pattern, slit or protrusion is formed in the pixel region. According to the optical alignment technology, a substrate is provided with a photo-reactive material, and a tilted ultraviolet irradiates a surface of the photo-reactive material. The pre-tilt of the alignment film is formed according to the irradiation direction. Therefore, the pixel unit can be divided into several regions and ultraviolet irradiates these regions from different directions, so that the pre-tilt of the liquid crystal molecules can be formed in different directions.

The pixel unit comprises a pixel electrode that is formed on one substrate, a common electrode that is formed on the other transparent substrate spaced from the substrate on which the pixel electrode is formed, and a liquid crystal layer that is arranged between the two substrates. The pixel electrode is formed on each of the pixel units that are arranged on one substrate, and the common electrode is formed on a whole surface of the other substrate. As a result, a fringe field would be generated between edges of the pixel electrodes and the common electrode. Due to the influence of the fringe field, some liquid crystal molecules are aligned independently and are not affected by the electric potential of the pixel electrode, and the light from the backlight module is shaded by the liquid crystal molecules. As a result, a fringe field texture (FFT) would appear in this region, i.e., a normal brightness cannot be shown in this region.

The pre-tilt direction of each of the domains is matched to a polarization axis of the polarizer that is fixed on the substrate of the liquid crystal display panel. Since the pre-tilt direction of each of the domains is basically perpendicular to at least one polarizer, the light which passes through the liquid crystal molecules near a domain boundary texture (DBT) or edges of the pixel electrodes is not perpendicular to the polarization axis of the polarizer. As a result, the brightness would be reduced in the region near the domain boundary texture (DBT) or edges of the pixel electrodes.

The aperture ratio of a pixel unit is a ratio of an area of the pixel unit which has a normal brightness to a total area thereof. A light transmittance of the pixel unit refers to a ratio of the brightness of the light which passes through the pixel unit to the brightness of the light that is emitted by the backlight module before passing through the pixel unit. Due to the existence of the domain boundary texture (DBT) and the fringe field texture (FFT), the brightness of the pixel unit would be reduced, and the aperture ratio and light transmittance of the pixel unit would be reduced accordingly.

According to the optical alignment technology, the pre-tilt angle is determined by a strength of the light and the irradiation time thereof. If the pre-tilt angle is too large, the liquid crystal molecules far from the alignment film would be aligned in a wrong manner and are not in consistent with the electric potential that is applied to the pixel electrodes. Consequently, the pixel unit would have brightness higher or lower than normal brightness. A picture contrast of the liquid crystal display panel would be reduced, and a black residual image would be generated. In a black residual image phenomenon, when a signal of a black image is provided to the pixel electrode, a gray color would appear on the pixel unit.

With the popularity of large sized liquid crystal televisions (TV), the market of large sized liquid crystal TV shows a good development trend. However, during production procedure, the large sized display panel has a low utilization ratio and a high cost. Therefore, the price of the large sized liquid crystal TV is relatively high, which limits the market development thereof.

At present, the aforesaid defect is eliminated through a mother substrate technology. That is, large sized panels and small sized panels are produced together in a large substrate, so that the production cost of large sized liquid crystal TV can be greatly reduced, as shown in FIG. 1. However, due to size difference among the panels, under a same view area curing condition, the liquid crystals in the panels have different pre-tilt angles since the panels have different numbers of pixels per inch in an active area thereof, as shown in FIGS. 2 and 3.

During a traditional view area curing procedure, the liquid crystal in the view area is doped with a certain proportion of reactive liquid crystal with a high purity (phototactic monomer). This kind of liquid crystal not only has a liquid crystal nucleus as the common liquid crystal molecule, but also has one or a plurality of reactive light energy base(s) at one end thereof, such as an acrylic base. Then, an external voltage is applied between an upper substrate and a lower substrate, so that the liquid crystal molecules can have a pre-tilt angle. In different domains of one pixel, the liquid crystal molecules have different tilt directions. Next, the substrates are irradiated by ultraviolet with a certain wavelength from the thin film transistor (TFT) side, the reactive liquid crystal are polymerized into a polymer network, which can attract the liquid crystal molecules in a surface layer and enable the liquid crystal molecules to form a fixed pre-tilt angle.

The chips with different sizes have different numbers of pixels per inch in an active area thereof, and thus the chips have different light transmittances during view area curing procedure. The larger the number of pixels per inch is; the smaller the aperture area of the TFT is; the lower the light transmittance will be; and the smaller the pre-tilt angle of the liquid crystal will become. In this case, there is a risk of poor liquid crystal diffusion, as shown in FIG. 2. The smaller the number of pixels per inch is; the larger the aperture area of the TFT is; the higher the light transmittance will be; and the larger the pre-tilt angle of the liquid crystal will become. In this case, there is a risk of broken bright spots, as shown in FIG. 3.

The number of pixels per inch is a unit of image resolution. Hence, if the number of pixels per inch is high, it means that the display screen can show the image with a high density.

SUMMARY OF THE INVENTION

With respect to the aforesaid technical problem in the prior art, the present disclosure provides an apparatus for improving optical alignment of panels manufactured on a same mother substrate.

The apparatus for improving optical alignment of panels manufactured on a same mother substrate comprises a mother substrate, N columns of chips in a first group, N columns of chips in a second group, and a photomask, wherein the N columns of chips in the first group and the N columns of chips in the second group are arranged in an alternate manner and are arranged on the mother substrate;

wherein an area of the chips in the second group is larger than an area of the chips in the first group;

wherein the photomask covers the N columns of chips in the first group and the N columns of chips in the second group so that ultraviolet irradiates the N columns of chips in the first group and the N columns of chips in the second group after passing through the photomask; and wherein N is a positive integer.

The N columns of chips in the first group and the N columns of chips in the second group with two different areas have different numbers of pixels per inch in an active area thereof.

A pixel comprises:

a first alignment film that is formed on a first substrate and a second alignment film that is formed on a second substrate and faces the first alignment film; and a plurality of adjacent domains, wherein the adjacent domains each comprise a region with normal brightness and a boundary region, and each boundary region defines a region between two adjacent domains.

A pre-tilt angle of liquid crystal molecules in the region with normal brightness is the same as a pre-tilt angle of liquid crystal molecules in the boundary region.

The photomask is a half-tone photomask.

The half-tone photomask comprises a pixel region and a peripheral wiring region, and the pixel region comprises a semi-transparent region.

A light transmittance of the semi-transparent region of the half-tone photomask decreases from a central part of the pixel region to an edge part thereof.

The semi-transparent region of the half-tone photomask comprises a first semi-transparent region and a second semi-transparent region, and a light transmittance of the second semi-transparent region is lower than a light transmittance of the first semi-transparent region.

A number of pixels per inch in an active area of the chips in the second group corresponds to the first semi-transparent region of the half-tone photomask. A number of pixels per inch in an active area of the chips in the first group corresponds to the second semi-transparent region of the half-tone photomask.

A wavelength of the ultraviolet ranges from 190 nm to 400 nm.

The following beneficial effects can be brought about according to the present disclosure.

According to the present disclosure, the chips with different sizes on the mother substrate are irradiated with ultraviolet of different strengths, and a half-tone photomask is added between the plate and the light source. As shown in FIG. 4, the chip with a large number of pixels per inch corresponds to a region of the photomask with a high light transmittance, and the chip with a small number of pixels per inch corresponds to a region of the photomask with a low light transmittance. Through regulating the light transmittance of the two kinds of chips, the liquid crystal in the two kinds of chips can have a similar pre-tilt angle, and the problems of poor liquid crystal diffusion and broken bright spots can be avoided, as shown in FIG. 5.

According to the present disclosure, different pixel regions of one pixel unit are provided with optical alignment of different strengths, so that the whole pixel unit can have a same optical alignment, and a display quality of the gate unit pixel can be improved.

According to the present disclosure, the light transmittance during view area curing procedure is regulated, so that the liquid crystal in the two kinds of chips can have a similar pre-tilt angle, as shown in FIG. 6. In this manner, the problems of poor liquid crystal diffusion and broken bright spots can be avoided.

According to the present disclosure, during view area curing procedure, a half-tone photomask is added between the plate and the light source. The chip with a large number of pixels per inch corresponds to a region of the photomask with a high light transmittance, and the chip with a small number of pixels per inch corresponds to a region of the photomask with a low light transmittance. In this manner, the relative light transmittance can be regulated, as shown in FIG. 5.

Compared with the view area curing procedure of a traditional mother substrate, according to the present disclosure, the relative light transmittance of the ultraviolet can be regulated during optical alignment procedure, so that the liquid crystal in the two kinds of chips can have a similar pre-tilt angle, and the problems of poor liquid crystal diffusion and broken bright spots can be avoided, as shown in FIG. 6.

The above technical features can be combined in any suitable manner, or substituted by the equivalent technical features, as long as the purpose of the present disclosure can be achieved.

BRIEF DESCRIPTION OF THE DRAWINGS

The present disclosure will be illustrated in detail hereinafter with reference to the embodiments and the accompanying drawings. In the drawings.

Figure 1:
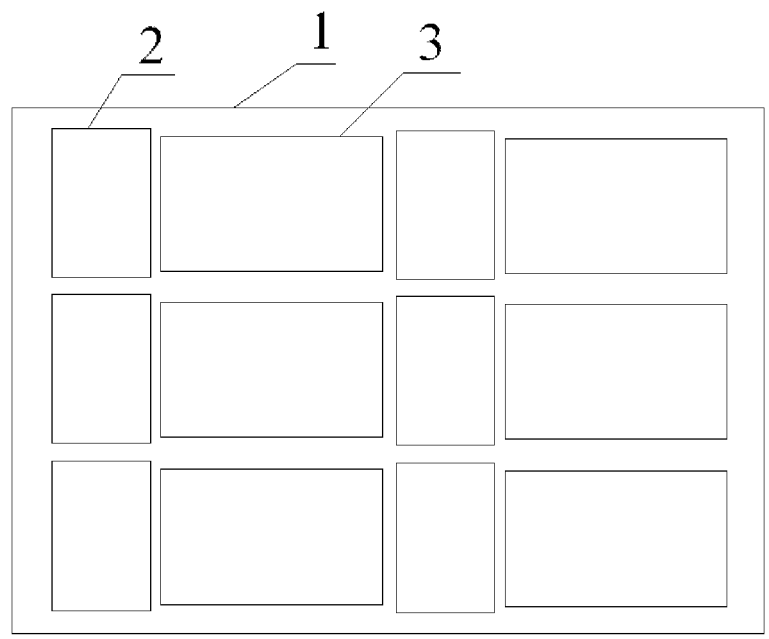
FIG. 1 schematically shows a mother substrate.

In the drawings, the same components are represented by the same reference signs, and the size of each component does not represent the actual size of the corresponding component.

DETAILED DESCRIPTION OF THE EMBODIMENTS

The present disclosure will be illustrated further with reference to the drawings.

Embodiment 1

The present embodiment will be illustrated below with reference to FIGS. 4 to 7. The present embodiment provides an apparatus for improving optical alignment of panels manufactured on a same mother substrate, which comprises a mother substrate 1, N columns of chips in a first group 2, N columns of chips in a second group 3, and a photomask 4, wherein the N columns of chips in the first group 2 and the N columns of chips in the second group 3 are arranged in an alternate manner and are arranged on the mother substrate 1;

wherein an area of the chips in the second group 3 is larger than an area of the chips in the first group 2;

wherein the photomask 4 covers the N columns of chips in the first group 2 and the N columns of chips in the second group 3 so that ultraviolet irradiates the N columns of chips in the first group 2 and the N columns of chips in the second group 3 after passing through the photomask 4; and wherein N is a positive integer.

Embodiment 2

The present embodiment differs from embodiment 1 in that, the N columns of chips in the first group (2) and the N columns of chips in the second group (3) with two different areas have different numbers of pixels per inch in an active area thereof.

The number of pixels per inch has an influence on a pre-tilt angle of the liquid crystal.

Other steps and parameters are the same as those in embodiment 1.

Embodiment 3

The present embodiment differs from embodiment 1 or 2 in that, a pixel comprises:

a first alignment film that is formed on a first substrate and a second alignment film that is formed on a second substrate and faces the first alignment film; and a plurality of adjacent domains, wherein the adjacent domains each comprise a region with normal brightness and a boundary region, and each boundary region defines a region between two adjacent domains.

Figure 9:
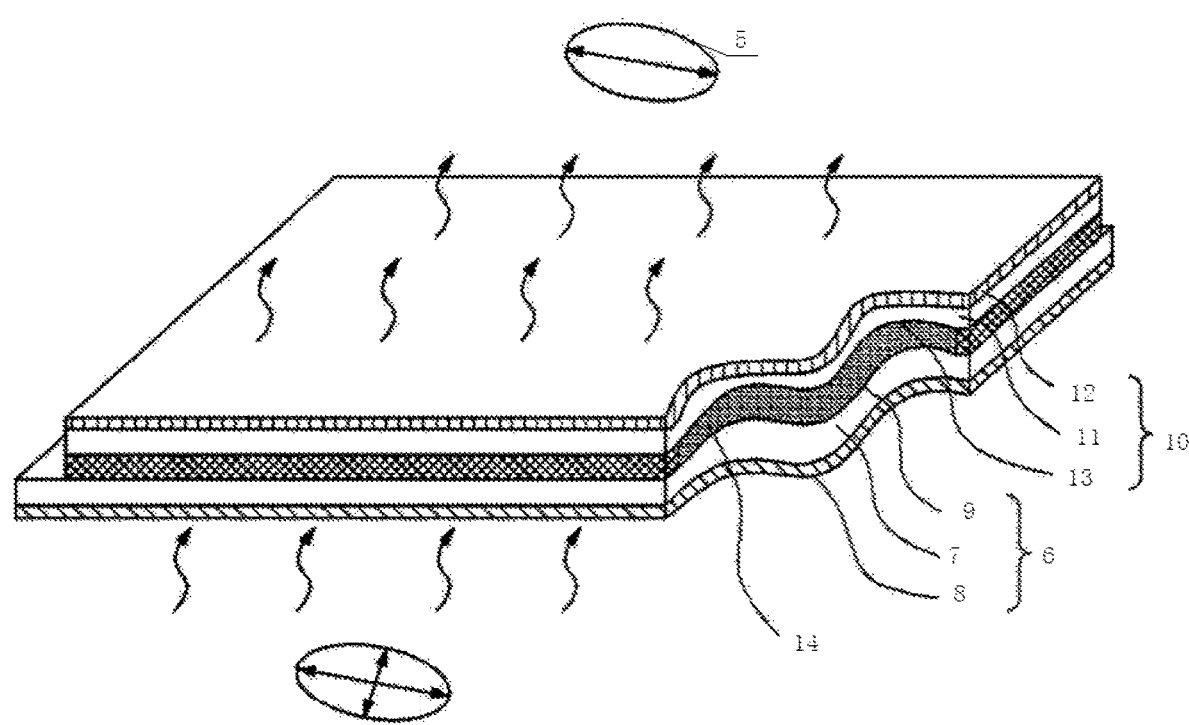
FIG. 9 is a sectional view of part of a liquid crystal display panel.

FIG. 9 is a sectional view of part of a liquid crystal display panel. FIG. 9 shows a combination of a liquid crystal layer and a substrate, and the substrate comprises a polarizer and an alignment film. As shown in FIG. 9, the liquid crystal display panel 5 comprises a first substrate 6, a second substrate 10, and a liquid crystal layer 14 that is arranged between the first substrate 6 and the second substrate 10.

As shown in FIG. 9, a first polarizer 8 is manufactured as a thin film and is affixed on an outer surface of a first baseplate 7 facing a backlight module. Selectively, the first polarizer 8 can be affixed on an inner surface of the first baseplate 7 facing the liquid crystal layer 14.

Other steps and parameters are the same as those in embodiment 1 or 2.

Embodiment 4

The present embodiment differs from one of embodiments 1 to 3 in that, a pre-tilt angle of liquid crystal molecules in the region with normal brightness is the same as a pre-tilt angle of liquid crystal molecules in the boundary region.

An alignment vector of the region with normal brightness is less than that of the boundary region.

The alignment vector of the region with normal brightness is a sum of an alignment vector of the first alignment film of the region with normal brightness and an alignment vector of the second alignment film thereof. The alignment vector of the boundary region is a sum of an alignment vector of the first alignment film of the boundary region and an alignment vector of the second alignment film thereof.

Other steps and parameters are the same as those in one of embodiments 1 to 3.

Embodiment 5

The present embodiment differs from one of embodiments 1 to 4 in that, the photomask 4 is a half-tone photomask.

Other steps and parameters are the same as those in one of embodiments 1 to 4.

Embodiment 6

The present embodiment differs from one of embodiments 1 to 5 in that, the half-tone photomask comprises a pixel region and a peripheral wiring region, and the pixel region comprises a semi-transparent region.

Other steps and parameters are the same as those in one of embodiments 1 to 5.

Embodiment 7

The present embodiment differs from one of embodiments 1 to 6 in that, a light transmittance of the semi-transparent region of the half-tone photomask decreases from a central part of the pixel region to an edge part thereof.

According to the technical solution of the present disclosure, the case that the photoresist in a channel of a pixel region near a peripheral wiring region of a TFT-LCD array substrate is relatively thin can be avoided, and the source-drain channel semiconductor lacking phenomenon after etching procedure can be avoided. Therefore, the poor pixel lighting phenomenon of the TFT-LCD can be alleviated.

Other steps and parameters are the same as those in one of embodiments 1 to 6.

Embodiment 8

The present embodiment differs from one of embodiments 1 to 7 in that, the semi-transparent region of the half-tone photomask comprises a first semi-transparent region and a second semi-transparent region, and a light transmittance of the second semi-transparent region is lower than a light transmittance of the first semi-transparent region.

Other steps and parameters are the same as those in one of embodiments 1 to 7.

Embodiment 9

The present embodiment differs from one of embodiments 1 to 8 in that, a number of pixels per inch in an active area of the chips in the second group corresponds to the first semi-transparent region of the half-tone photomask 4, and a number of pixels per inch in an active area of the chips in the first group corresponds to the second semi-transparent region of the half-tone photomask 4.

Figure 6:
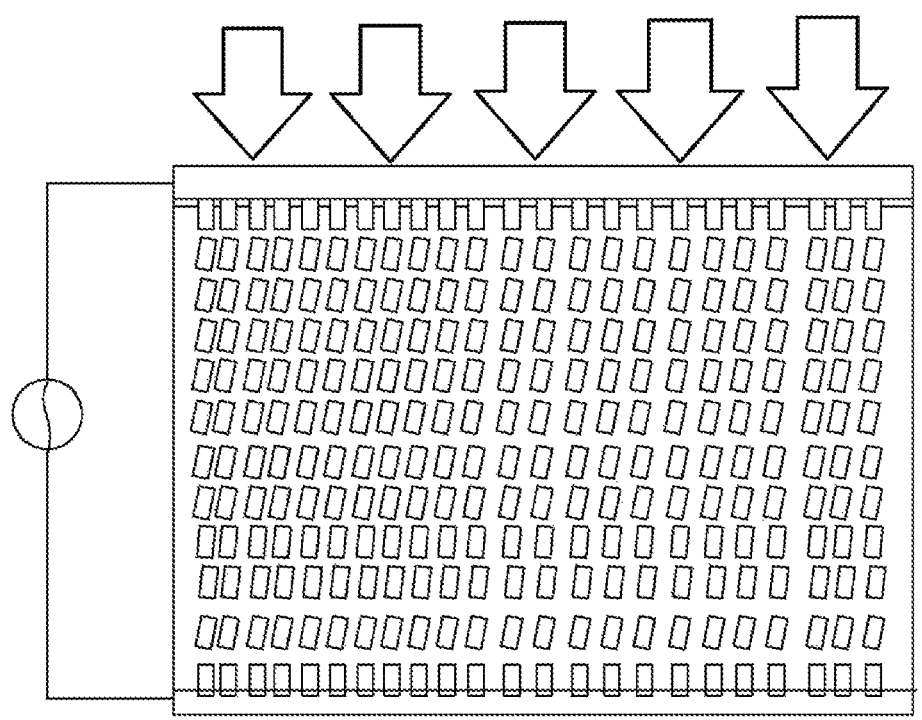
FIG. 6 schematically shows a pre-tilt state of a liquid crystal in a panel according to the present disclosure.

Through regulating the light transmittance of the two kinds of chips, the liquid crystal in the two kinds of chips can have a similar pre-tilt angle, and the problems of poor liquid crystal diffusion and broken bright spots can be avoided, as shown in FIG. 6.

Other steps and parameters are the same as those in one of embodiments 1 to 8.

Embodiment 10

The present embodiment differs from one of embodiments 1 to 9 in that, a wavelength of the ultraviolet ranges from 190 nm to 400 nm.

The ultraviolet comprises ray A, ray B, and ray C, which have a wavelength from 315 nm to 400 nm, from 280 nm to 315 nm, and from 190 nm to 280 nm respectively.

Other steps and parameters are the same as those in one of embodiments 1 to 9.

TABLE 1

Figure 2:
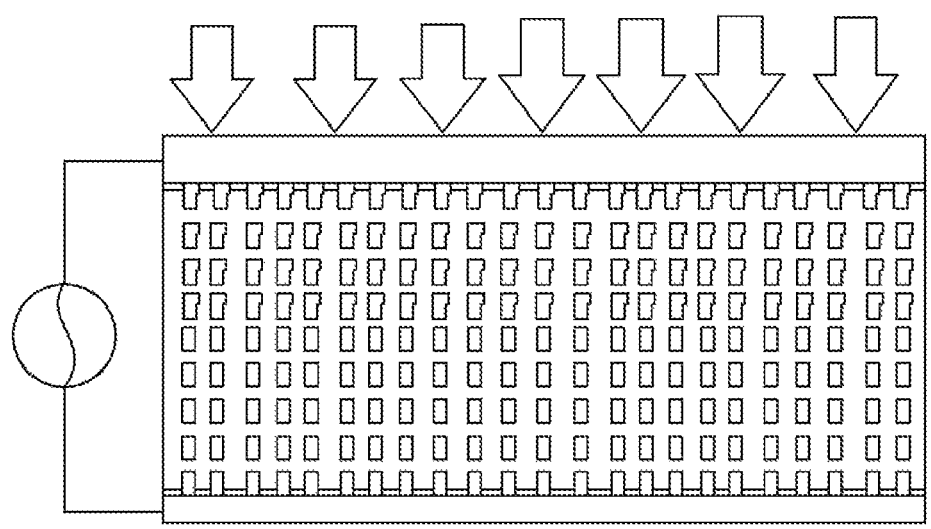
FIG. 2 schematically shows a pre-tilt state of liquid crystal of a panel with a large number of pixels per inch.
Figure 3:
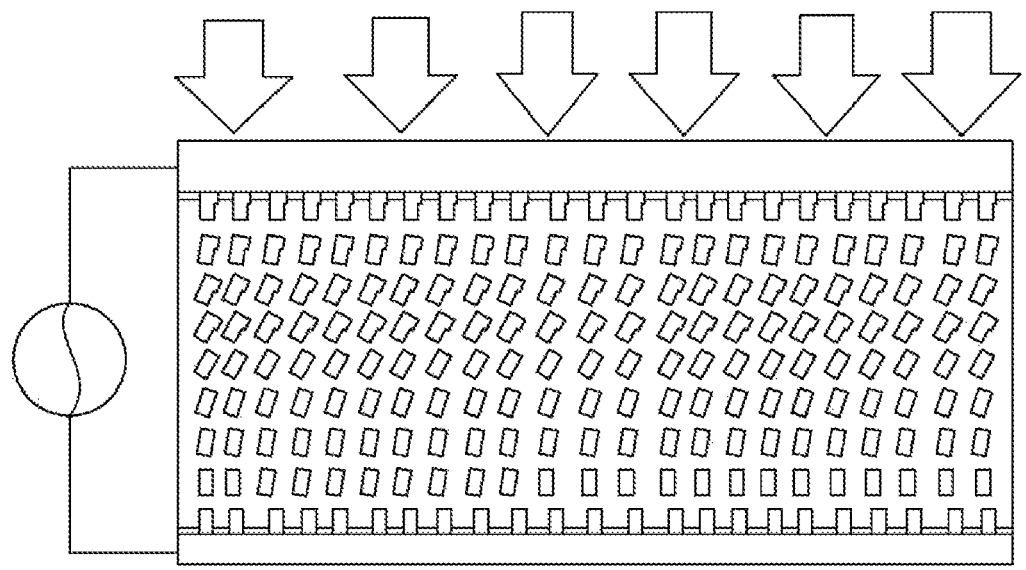
FIG. 3 schematically shows a pre-tilt state of liquid crystal of a panel with a small number of pixels per inch.
Figure 4:
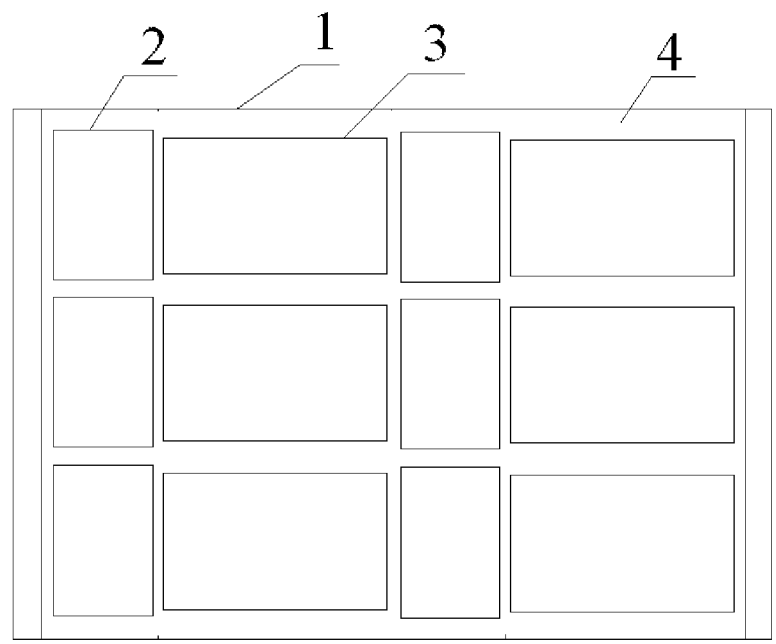
FIG. 4 schematically shows an optical alignment device of the mother substrate according to the present disclosure.
Figure 5:
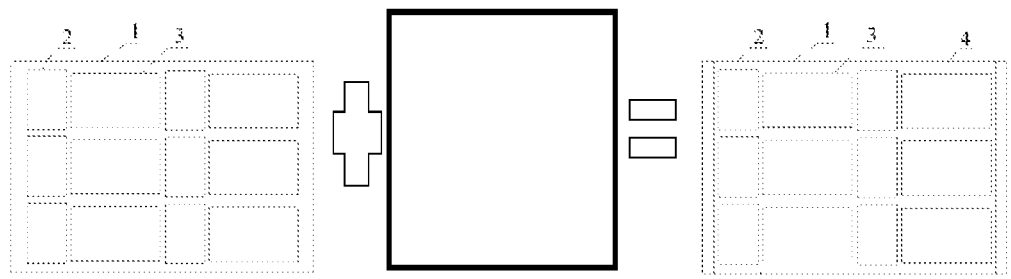
FIG. 5 schematically shows a step of adding a photomask to the mother substrate according to the present disclosure.
Figure 7:
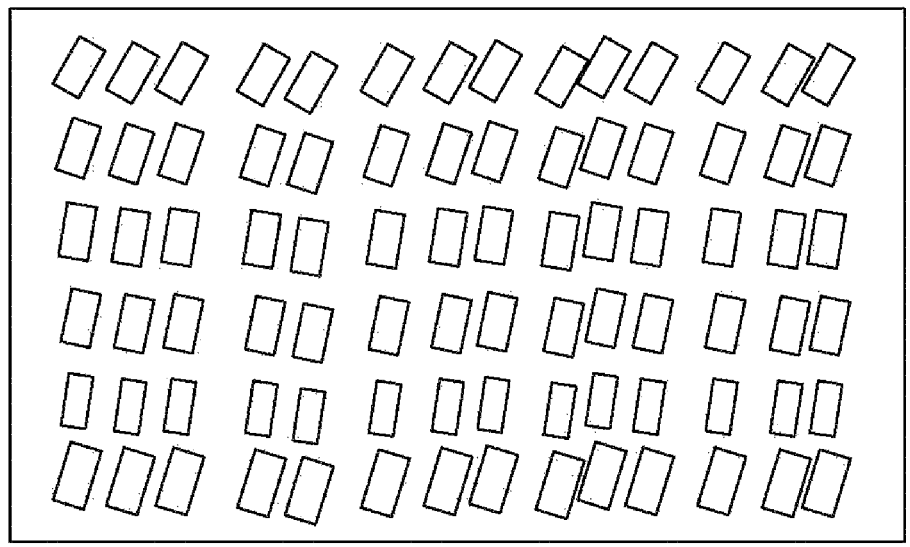
FIG. 7 schematically shows a pre-tilt state of liquid crystal of a panel with a large number of pixels per inch according to the present disclosure.
Figure 8:
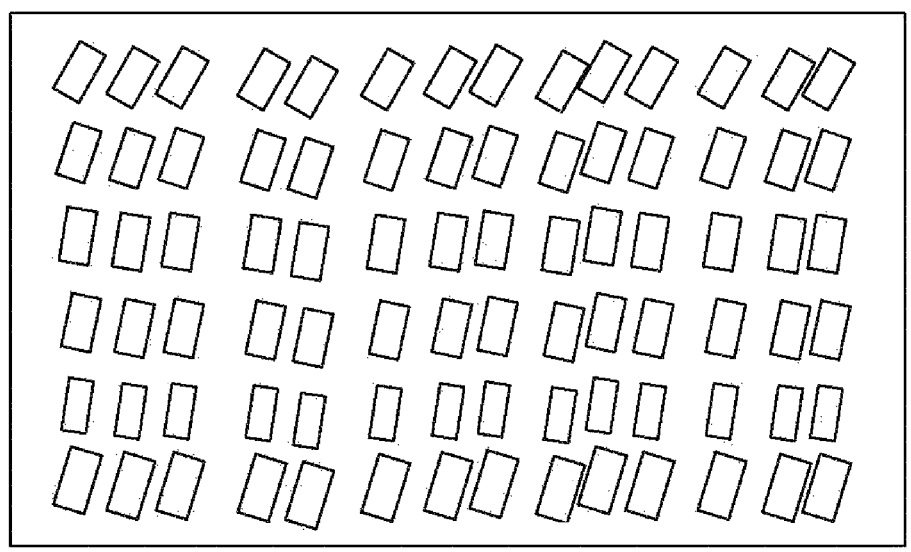
FIG. 8 schematically shows a pre-tilt state of liquid crystal of a panel with a small number of pixels per inch according to the present disclosure.

| AR comparative table | | | | |
|---|---|---|---|---|
| Mother substrate | Original mother substrate | | New design | |
| Whole plate | FIG. 1 | | FIG. 4 | |
| Number of pixels per inch | Large | Small | Large | Small |
| Analog figures | FIG. 2 | FIG. 3 | FIG. 7 | FIG. 8 |

AR is short for Augmented Reality.

Although the present disclosure is described hereinabove with reference to specific embodiments, it can be understood that, these embodiments are merely examples of the principles and applications of the present disclosure. Hence, it can be understood that, numerous modifications can be made to the embodiments, and other arrangements can be made, as long as they do not go beyond the spirit and scope of the present disclosure as defined by the appended claims. It can be understood that, different dependent claims and features described herein can be combined in a manner different from those described in the initial claims. It can also be understood that, the technical features described in one embodiment can also be used in other embodiments.

The invention claimed is:

1. An apparatus for improving optical alignment of panels manufactured on a same mother substrate, comprising a mother substrate (1), N columns of chips in a first group (2), N columns of chips in a second group (3), and a photomask (4),
    wherein the N columns of chips in the first group (2) and the N columns of chips in the second group (3) are arranged in an alternate manner and are arranged on the mother substrate (1);
    wherein an area of the chips in the second group (3) is larger than an area of the chips in the first group (2);
    wherein the photomask (4) covers the N columns of chips in the first group (2) and the N columns of chips in the second group (3) so that ultraviolet irradiates the N columns of chips in the first group (2) and the N columns of chips in the second group (3) after passing through the photomask (4); and
    wherein N is a positive integer;
    wherein the N columns of chips in the first group (2) and the N columns of chips in the second group (3) with two different areas have different numbers of pixels per inch in an active area thereof;
    wherein the photomask (4) is a half-tone photomask;
    wherein the half-tone photomask comprises a pixel region and a peripheral wiring region, and the pixel region comprises a semi-transparent region;
    wherein a light transmittance of the semi-transparent region of the half-tone photomask decreases from a central part of the pixel region to an edge part thereof.

2. The apparatus according to claim 1, wherein a pixel comprises:

a first alignment film that is formed on a first substrate and a second alignment film that is formed on a second substrate and faces the first alignment film; and a plurality of adjacent domains, wherein the adjacent domains each comprise a region with normal brightness and a boundary region, and each boundary region defines a region between two adjacent domains.

3. The apparatus according to claim 2, wherein a pre-tilt angle of liquid crystal molecules in the region with normal brightness is the same as a pre-tilt angle of liquid crystal molecules in the boundary region.

4. The apparatus according to claim 1, wherein the semi-transparent region of the half-tone photomask comprises a first semi-transparent region and a second semi-transparent region, and a light transmittance of the second semi-transparent region is lower than a light transmittance of the first semi-transparent region.

5. The apparatus according to claim 4, wherein a number of pixels per inch in an active area of the chips in the second group (3) corresponds to the first semi-transparent region of the half-tone photomask; and wherein a number of pixels per inch in an active area of the chips in the first group (2) corresponds to the second semi-transparent region of the half-tone photomask.

6. The apparatus according to claim 5, wherein a wavelength of the ultraviolet ranges from 190 nm to 400 nm.

7. The apparatus according to claim 2, wherein an alignment vector of the region with normal brightness is less than that of the boundary region.

8. The apparatus according to claim 7, wherein the alignment vector of the region with normal brightness is a sum of an alignment vector of the first alignment film of the region with normal brightness and an alignment vector of the second alignment film thereof;

the alignment vector of the boundary region is a sum of an alignment vector of the first alignment film of the boundary region and an alignment vector of the second alignment film thereof.

* * * * *